United States Patent
Poeppel

(10) Patent No.: US 6,847,855 B2
(45) Date of Patent: Jan. 25, 2005

(54) METHOD FOR FAULT ANALYSIS IN WAFER PRODUCTION

(75) Inventor: Gerhard Poeppel, Regensburg (DE)

(73) Assignee: Infineon Technologies AG, Münich (DE)

( * ) Notice: Subject to any disclaimer, the term of this patent is extended or adjusted under 35 U.S.C. 154(b) by 0 days.

(21) Appl. No.: 10/356,904

(22) Filed: Feb. 3, 2003

(65) Prior Publication Data

US 2003/0148547 A1 Aug. 7, 2003

(30) Foreign Application Priority Data

Feb. 4, 2002 (DE) .......................................... 102 04 426

(51) Int. Cl.$^7$ .......................... G06F 19/00; G01N 37/00
(52) U.S. Cl. .......................... 700/110; 700/121; 702/84
(58) Field of Search .......................... 700/108–110, 121; 702/81–83, 84

(56) References Cited

U.S. PATENT DOCUMENTS

| | | | |
|---|---|---|---|
| 5,497,381 A | 3/1996 | O'Donoghue et al. | |
| 5,838,951 A | * 11/1998 | Song ............................. | 716/19 |
| 5,991,699 A | * 11/1999 | Kulkarni et al. ............... | 702/83 |
| 6,393,602 B1 | * 5/2002 | Atchison et al. ................ | 716/4 |
| 2002/0156550 A1 | * 10/2002 | Langford ...................... | 700/110 |

FOREIGN PATENT DOCUMENTS

DE    100 36 961    8/2001

OTHER PUBLICATIONS

Lee et al, "Design of Intelligent Data Sampling Methodology Based on Data Mining", *IEEE Transactions on Robotics and Automation*, vol. 17, No. 5, Oct. 2001, pp. 637–649.

Langfold et al, "The Application and Validation of a New Robust Windowing Method for the Poisson Yield Model", *2001 IEEE/SEMI Advanced Semiconductor Manufacturing Conference*, Apr. 2001, pp. 157–160.

* cited by examiner

Primary Examiner—Albert W. Paladini
Assistant Examiner—R Jarrett
(74) Attorney, Agent, or Firm—Schiff Hardin LLP

(57) ABSTRACT

With the aid of the method for fault analysis according to the invention, a wide variety of chips are mapped by means of a transformation onto at least one uniform comparable wafer map. This transformation or rescaling enables a chip-area-independent assessment of the products or the fabrication processes. The method for fault analysis according to the invention furthermore has the advantage that the information thus obtained can be stored very compactly in corresponding wafer databases and is thus available for further evaluations.

16 Claims, 3 Drawing Sheets

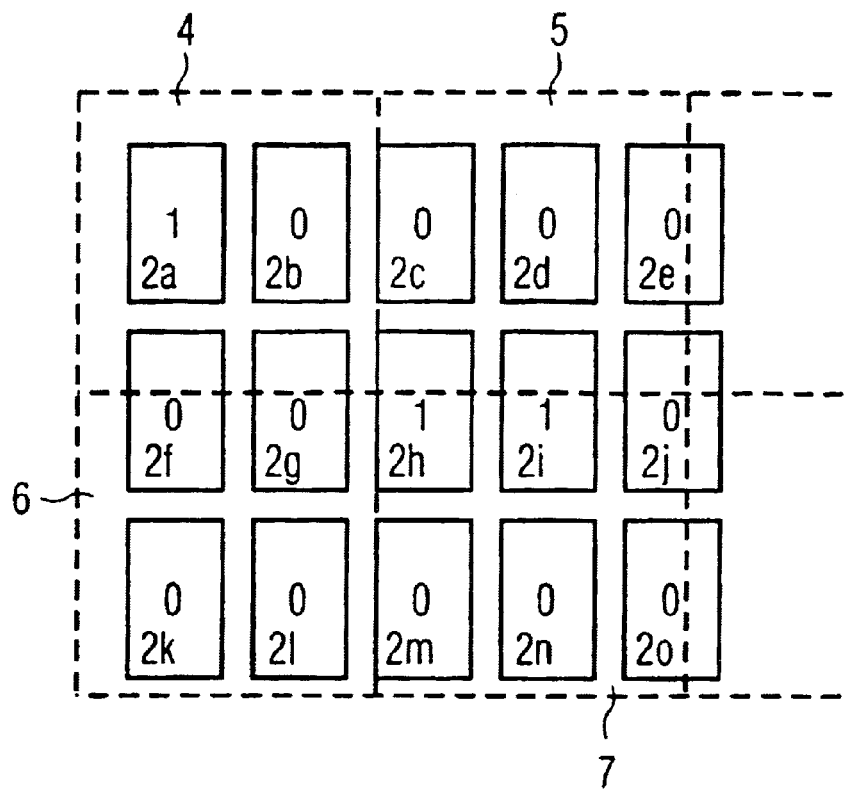

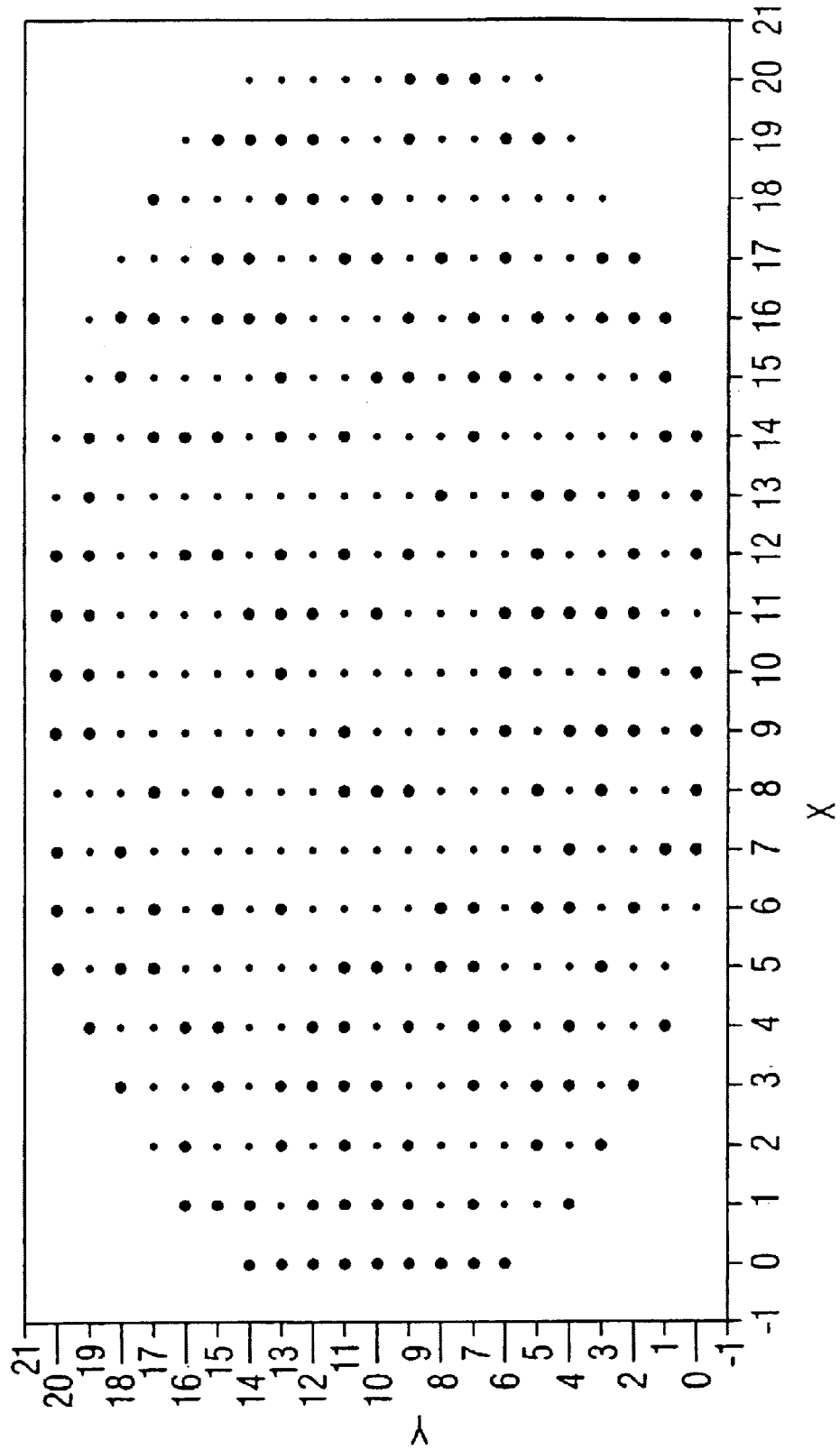

METHOD FOR FAULT ANALYSIS IN WAFER PRODUCTION

BACKGROUND OF THE INVENTION

1. Field of the Invention

The present invention relates to a method for fault analysis in wafer production, and, in particular, to a method for fault analysis for use for the production of integrated semiconductor products.

2. Description of the Related Art

As a rule, integrated semiconductor products are fabricated with the aid of "wafers". A wafer is usually subdivided into a multiplicity of "chips" which finally correspond to the integrated semiconductor products at the end of production, in particular, after the wafer has been sawn apart. In this case, the size of the individual chips and the number of chips per wafer are essentially prescribed by the design and the type of the semiconductor product to be fabricated. The design and the type of the semiconductor product to be fabricated furthermore determine what fabrication process is undergone by the wafer.

At the end of fabrication, the chips are finally tested to determine whether or not the chips function. As a rule, these tests are carried out before the wafer is sawn apart. In this connection, the ratio of functioning chips to the total number of chips fabricated is one of the essential parameters. This parameter substantially determines the economics of the production in its entirety.

Furthermore, the results of the tests are used for fault analyses. Thus, by way of example, the intention is to find out whether systematic faults occur during the fabrication or whether the design of the semiconductor product to be fabricated has systematic faults or weaknesses. If the presence of such a fault can be discerned, it would be desirable, of course, if the fault source could also be determined.

As a rule, the starting point for corresponding fault analyses is a "multiple chip analysis" ("multiple window analysis") in which ever larger, fictitious chips are formed, in a plurality of steps, from the chips present on the wafer. Such a fictitious chip, which is composed of a predetermined number of adjacent real chips, is regarded as a functioning chip if all the real chips from which it is constructed function. By contrast, if just one of said real chips is faulty, then the fictitious chip is also regarded as faulty. From the data thus obtained, it is then possible, under specific model assumptions, to determine the "electrically effective defect density", which is important for further-reaching analyses.

Unfortunately, a series of difficulties arise when employing the multiple chip analysis. Thus, misinterpretations occur, for example, in the case of specific, relatively regular arrangements of the faulty chips on the wafer ("declustered fails") since such arrangements are generally not identified correctly. Furthermore, such regular arrangements, which are restricted only to a part of the wafer, can adversely affect the correct identification of "normal" fault arrangements ("clustered fails") since a type of compensation can occur between declustered fails and clustered fails.

In practice, in order to determine the electrically effective defect density, it is often necessary to carry out a regression, which can in turn lead to faulty results. Furthermore, the results may depend on the number of steps which lead to the fictitious chips that become ever larger, and on the way in which the real chips are combined to form the fictitious chips. Furthermore, the number of fictitious chips is dependent on the number of real chips on the wafer.

In the production of integrated semiconductor products, a multiplicity of different integrated semiconductor products are usually fabricated simultaneously at one production site. This means that a multiplicity of wafers with chips of different sizes and with a different number of chips are processed simultaneously. Even if the different semiconductor products are fabricated by means of the same technology, i.e., by means of essentially the same fabrication method, the test results of different semiconductor products cannot be directly compared with one another on the basis of the analysis methods used to date. This means that it often takes a very long time before faults in the fabrication process can be identified.

SUMMARY OF THE INVENTION

Therefore, the present invention is based on the object of providing a method for fault analysis in wafer production which reduces or completely avoids the problems described and which enables a cross-product fault analysis.

This object is achieved by the method for fault analysis in wafer production according to the invention in accordance with the description below.

The invention provides a method for fault analysis in wafer production having the following steps:

a) at least one wafer with a multiplicity of chips is provided, b) the chips are examined at least with regard to one property, c) the results of the examination are transferred to at least one standard wafer with a predetermined number of standard chips which each have a predetermined size, and d) the transferred results are evaluated.

With the aid of the method for fault analysis according to the invention, a wide variety of chips are mapped using a transformation onto at least one uniform comparable wafer map with standard chips of the same size. This transformation or rescaling enables a chip-area-independent assessment of the products or the fabrication processes. The method for fault analysis according to the invention furthermore has the advantage that the information thus obtained can be stored very compactly in corresponding wafer databases and is thus available for further evaluations.

The method according to the invention makes it possible to carry out automatic wafer map comparisons and thus to carry out cross-product, wafer-map-specific analyses of the examination results. If the method according to the invention is applied, for example, to similar semiconductor products (same number of critical planes, same integration density of the circuit, no particular systematic faults between the products), then yield identity between the products would be expected given the same electrically effective defect density as a result of the area normalization. Any immediately visible deviation from this then leads to a contribution to be explained and can thus contribute to the identification of potentials or to the explanation of deficits.

In this case, the application of the method according to the invention is not restricted to the field of semiconductor production. In many other areas of technology (e.g., biotechnology), a multiplicity of identical but independent units (chips) are fabricated simultaneously on a carrier (wafer) and examined for compliance with predetermined specifications. Accordingly, the method for fault analysis according to the invention can be expediently used not only in semiconductor production but also in other areas of technology.

In accordance with one preferred embodiment of the method according to the invention, in order to transfer the results of the examination to the standard wafer, each standard chip on the standard wafer is assigned at least one chip on the wafer.

In this case, it is particularly preferred if a respective chip on the wafer is assigned the standard chip on the standard wafer which covers the largest proportion of the area of the chip if the standard wafer is projected onto the wafer. Furthermore, it is preferred if a respective chip on the wafer is assigned the standard chips on the standard wafer which cover a proportion of the area of the chip if the standard wafer is projected onto the wafer.

In accordance with a further preferred embodiment of the method according to the invention, a standard chip is assigned all the chips whose area is completely covered by the standard chip if the standard wafer is projected onto the wafer, and a standard chip is assigned, according to the random principle, the chips whose area is incompletely covered by the standard chip if the standard wafer is projected onto the wafer. In this case, it is particularly preferred if the probability with which a chip is assigned to a standard chip is proportional to the area covered by the standard chip on the chip if the standard wafer is projected onto the wafer.

In accordance with a further preferred embodiment of the method according to the invention, the results of the examination are transferred to the standard wafer by the results for the standard chips being determined from the results of the assigned chips. In this case, it is particularly preferred if a standard chip has a specific result if at least one of the assigned chips has the result.

In accordance with a further preferred embodiment of the method according to the invention, a standard chip has a specific result if a weighted sum of the results of the assigned chips fulfills a predetermined criterion. In this case, it is particularly preferred if the weighted sum of the results is determined using the covered proportions of the area of the chips assigned to the standard chip.

In accordance with a further preferred embodiment of the method according to the invention, at least one specific result is transferred according to the random principle from the chips assigned to the respective standard chip to the standard chip. In this case, it is particularly preferred if the probability with which the specific result is transferred to the standard chip depends on the sum of the proportions of the area—covered by the standard chip—of the chips which have the specific result. Furthermore, it is preferred for the specific result to be reliably transferred to the standard chip if the sum of the proportions of the area—covered by the standard chip—of the chips which have the specific result is greater than or equal to the area of a complete chip on the wafer.

In accordance with a further preferred embodiment of the method according to the invention, the chips are examined with regard to their functionality. Accordingly, it is preferred to determine the yield from the examination results. The area-normalized yield then obtained through the method according to the invention is appropriate as an efficient monitoring instrument, e.g., for monitoring the production quality and also the production stability. Furthermore, it is preferred to determine the electrically effective defect density for the evaluation.

DESCRIPTION OF THE DRAWINGS

The invention is illustrated in greater detail below with reference to the Figures.

FIG. 1 is a pictorial diagram showing a partial region of a wafer to which a method for fault analysis according to the invention is applied;

FIG. 2 is a pictorial diagram showing a partial region of a wafer onto which a corresponding partial region of a standard wafer is projected;

FIG. 3 is a pictorial diagram showing a complete wafer, with the results of a functional test.

DETAILED DESCRIPTION OF THE INVENTION

Figure 4:
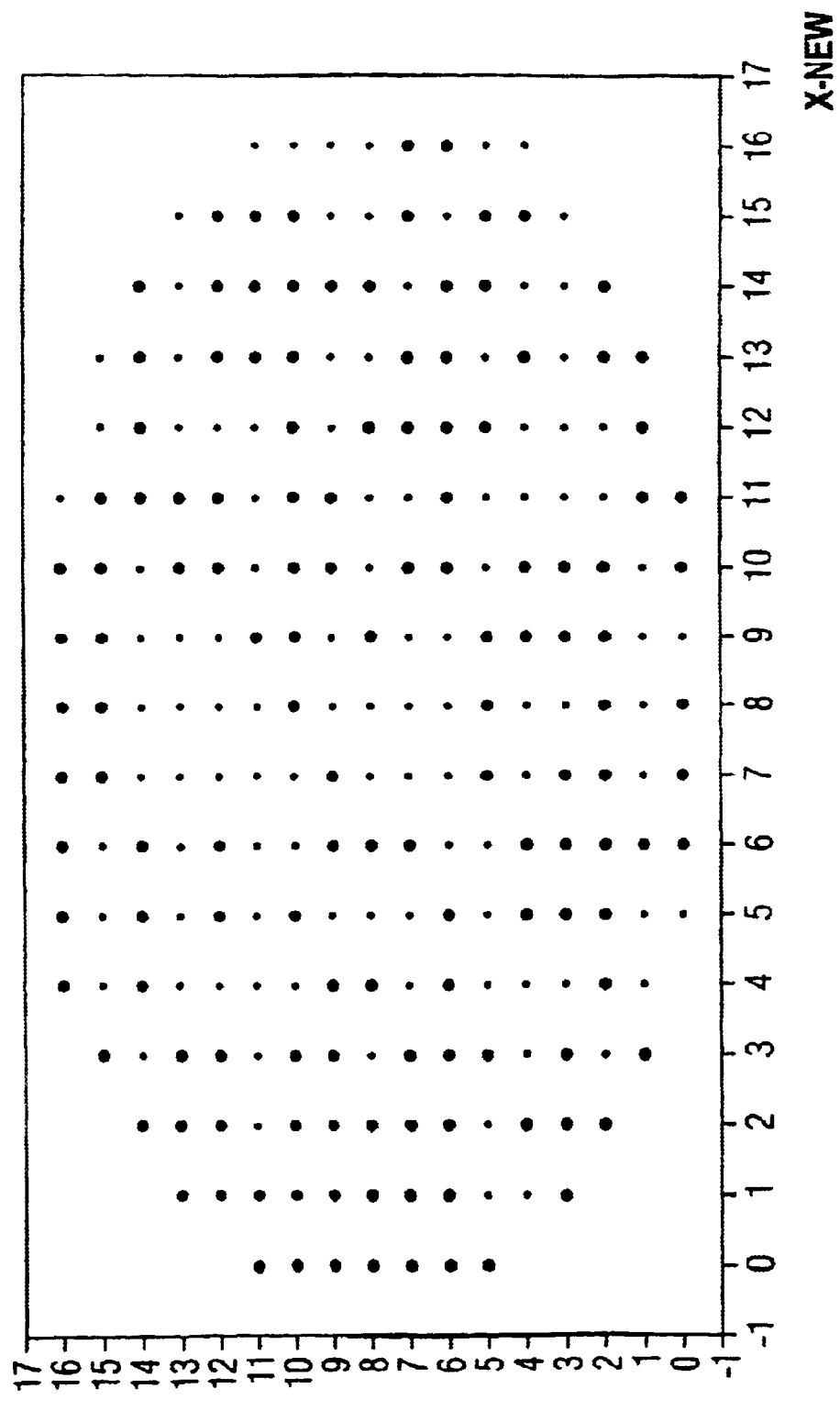
FIG. 4 is a pictorial diagram showing a complete standard wafer, with the correspondingly transferred results of a functional test.

FIG. 1 shows a partial region of a wafer to which a method for fault analysis according to the invention is applied. A multiplicity of identical but mutually independent chips 2a to 2o are arranged on the wafer. In the present example, the chips 2a to 2o are integrated circuits or integrated semiconductor products that are tested in respect of their functionality after completion. These tests are usually carried out at a time at which the chips are still arranged on the wafer and the wafer has not yet been sawn apart.

If a chip passes this test, it is assigned the value 0. If a functional fault of the chip is ascertained during the test, then the corresponding chips are assigned the value 1. Consequently, the example shown in FIG. 1 contains three faulty chips 2a, 2h and 2i. The faulty chips are usually marked after the tests so that they can be separated by sorting after the wafer has been sawn apart.

The size of the chips 2a to 2o depends both on the nature and type of the fabricated semiconductor product and on the fabrication process used (technology generation). The different size of the chips has the consequence, of course, that the number of chips per wafer also depends on the nature and type of the fabricated semiconductor product and also on the fabrication process used. The different size of the chips and the different number of chips per wafer have meant that cross-product analyses could be carried out only to an inadequate extent in the case of the methods for fault analysis used previously.

In order to enable cross-product fault analyses, the results of the functional tests are now transferred to at least one standard wafer with a predetermined number of standard chips which each have a predetermined size. In this case, it is particularly preferred if, in order to transfer the results of the functional tests, each standard chip on the standard wafer is assigned at least one chip on the wafer. FIG. 2 shows the partial region of the wafer shown in FIG. 1, onto which is projected a corresponding partial region of a standard wafer with the standard chips 4, 5, 6 and 7.

In accordance with a first embodiment of the method according to the invention, the assignment between chips 2a to 2o and the standard chips 4, 5, 6 and 7 is carried out in a manner such that a respective chip on the wafer is assigned the standard chip on the standard wafer which covers the largest proportion of the area of the chip if the standard wafer is projected onto the wafer. In the example shown in FIG. 2, this means that the chips 2a and 2b are assigned the standard chip 4. Moreover, the chips 2c, 2d and 2e are assigned to the standard chip 5 and the chips 2f, 2g, 2k and 2l are assigned to the standard chip 6. Finally, the chips 2h, 2i, 2j, 2m, 2n and 2o are assigned to the standard chip 7.

The results of the functional tests are then transferred to the standard wafer by the results for the standard chips being determined from the results of the assigned chips. Thus, in one embodiment of the method according to the invention, a standard chip has a specific result if at least one of the chips assigned to it has the result. In the present example, the faultiness of the chips is chosen as the specific result. It follows from this that, in the present example, the standard chip 4 is assessed as faulty (value=1) since the chip 2a assigned to it is faulty. Furthermore, the standard chips 5 and 6 are assessed as not faulty (value=0) since none of the chips assigned to them is faulty. By contrast, the standard chip 7 is again assessed as faulty (value=1) since the chips 2h and 2i respectively assigned to it are faulty.

From the transferred results, it is then possible to determine, by way of example, the ratio of the number of fault-free standard chips to the total number of standard chips. This ratio corresponds to an area-normalized yield Y_fn, which is appropriate as an efficient monitoring instrument, e.g., for monitoring the production quality and also the production stability.

In accordance with a further embodiment of the method according to the invention, the assignment between chips 2a to 2o and the standard chips 4, 5, 6 and 7 is carried out in a manner such that a standard chip is assigned all the chips whose area is completely covered by the standard chip, and a standard chip is assigned, according to the random principle, the chips whose area is only incompletely covered by the standard chip.

In the case of the example shown in FIG. 2, this might mean that the chips 2a, 2b and, on account of the random principle, the chip 2f are assigned the standard chip 4. Furthermore, the chips 2c, 2d and, on account of the random principle, the chips 2e and 2h are assigned to the standard chip 5 and the chips 2k, 2l are assigned to the standard chip 6. Finally, the chips 2m, 2n and, on account of the random principle, the chips 2i, 2j and 2o are assigned to the standard chip 7. In the case of such an in part random-based assignment between the chips and the standard chips, it can happen that one or more chips, in this case the chip 2g, is assigned no standard chip. However, if the standard chips are chosen to be sufficiently large relative to the chips, it is ensured that each standard chip is assigned at least one chip.

The results of the functional tests are then transferred to the standard wafer, a standard chip again having a specific result if at least one of the chips assigned to it has the result. It follows from this that, in the present example, the standard chip 4 is assessed as faulty (value=1) since the chip 2a assigned to it is faulty. Furthermore, the standard chip 5 is then also assessed as faulty (value=1) since the chip 2h randomly assigned to it is faulty. The standard chip 6 is assessed as fault-free since none of the chips assigned to it is faulty. By contrast, the standard chip 7 is again assessed as faulty (value=1) since the chip 2i randomly assigned to it is faulty.

Such an in part random assignment between the standard chips and the chips can be effected for example by way of a coordinate transformation which converts between the coordinates (interval length 1) of the chips and the coordinates of the standard chips and which contains the call of a random function. It is thus generally possible for the coordinates of the standard wafer to be constructed in the grid x_new_min, x_new_max, y_new_min and y_new_max. Furthermore, the given, real wafer can also generally be classified by a grid x_min, x_max, y_min and y_max.

Using the formulae:

$$x\_new = \text{round}((x - x\_min + \text{random}) \cdot (x\_new\_max - x\_new\_min + 1)/(x\_max - x\_min + 1) - 0.5) + x\_new\_min$$

and $$y\_new = \text{round}((y - y\_min + \text{random}) \cdot (y\_new\_max - y\_new\_min + 1)/(y\_max - y\_min + 1) - 0.5) + y\_new\_min$$

the corresponding coordinates of the standard chip are calculated from the coordinates of the chip. In this case, the function "random" generates uniformly distributed random numbers in the interval (0, 1). As a result of this specification, a chip with the coordinates x, y is assigned precisely only to a standard chip with the coordinates x_new, y_new in accordance with the corresponding area proportion probability.

The effects of this transformation are shown by way of example in FIGS. 3 and 4. FIG. 3 diagrammatically shows a complete wafer with almost 400 chips. Furthermore, the results of a functional test are indicated by the dots of different sizes in FIG. 3. In this case, a large dot denotes a faulty chip, while a small dot denotes a fault-free chip.

FIG. 4 diagrammatically shows a complete standard wafer, with the correspondingly transferred results of a functional test. The chips were assigned to the standard chips with the aid of the coordinate transformation described above. In this case, a standard chip was regarded as faulty if at least one of the chips assigned to it is faulty. An area-normalized wafer map is obtained in this way, which is available for a further statistical analysis. The data thus obtained can then be added to the data already present at the wafer level or be evaluated in correspondingly condensed form.

In accordance with a further embodiment of the method according to the invention, the assignment between chips 2a to 2o and the standard chips 4, 5, 6 and 7 is carried out in a manner such that a respective chip on the wafer is assigned the standard chips on the standard wafer which cover a proportion of the area of the chip if the standard wafer is projected onto the wafer.

In the example shown in FIG. 2, this means that the standard chip 4 is assigned the chips 2a, 2b, 2f and 2g. Furthermore, the standard chip 5 is assigned the chips 2c, 2d, 2e, 2h, 2i and 2j and the standard chip 6 is assigned the chips 2f, 2g, 2k and 2l. Finally, the chips 2h, 2i, 2j, 2m, 2n and 20 are assigned to the standard chip 7. Accordingly, in this embodiment of the method, many chips are assigned more than one standard chip.

The results of the functional tests are then again transferred to the standard wafer, a standard chip having a specific result if a weighted sum of the results of the assigned chips fulfills a predetermined criterion. In this case, it is particularly preferred if the weighted sum of the results is determined using the covered proportions of the area of the chips assigned to the standard chip. If the criterion used is, for example, the criterion that the weighted sum is greater than or equal to one, then this has the consequence that the standard chip 4 is assessed as faulty since the chip 2a is faulty and this chip enters into the weighted sum 100% with regard to the standard chip 4. Accordingly, the criterion is already fulfilled by the contribution of chip 2a to the weighted sum.

By contrast, standard chip 5 is assessed as fault-free. Although the chips 2h and 2i assigned to the standard chip 5 yield a positive contribution to the weighted sum, their area proportions with regard to standard chip 5 are too small to enable the criterion (sum greater than one) to be fulfilled. The standard chip 6 is assessed as fault-free because none of the chips assigned to it yields a positive contribution to the sum. By contrast, the standard chip 7 is assessed as faulty because the corresponding weighted sum becomes greater than one through the contributions of the chips 2h and 2i.

In accordance with a further embodiment of the method according to the invention, the assignment between chips 2a to 2o and the standard chips 4, 5, 6 and 7 is again carried out in a manner such that a respective chip on the wafer is assigned the standard chips on the standard wafer which cover a proportion of the area of the chip if the standard wafer is projected onto the wafer.

In contrast to the preceding embodiment, the results are not transferred to the standard chips in the form of a weighted sum, rather at least one specific result is transferred according to the random principle from the chips assigned to the respective standard chip to the standard chip. In the present example, the specific result is again the faultiness (value=1) of the chips.

In this case, it is particularly preferred if the probability with which this result (value=1) is transferred to the standard chip depends on the sum of the proportions of the area—covered by the standard chip—of the chips which have the specific result. Furthermore, it is preferred for the specific result to be reliably transferred to the standard chip if the sum of the proportions of the area—covered by the standard chip—of the chips which have the specific result is greater than or equal to the area of a complete chip on the wafer.

In the example shown in FIG. 2, the standard chip 4 is assessed as faulty since the chip 2a is faulty and its entire area is covered by the standard chip 4. Accordingly, the value 1 is transferred reliably, i.e., with a probability 1, to the standard wafer. The standard chip 5 is assessed as faulty with a certain probability (p≈0.6) since the sum of the parts of the area of the chips 2h and 2i which are covered by the standard wafer 5 amounts to 60% of the area of a complete chip. If the result 1 is not transferred to the standard chip 5 when the method is carried out by a random generator, then the result 0 is transferred as the "default value" to the standard chip 5 and the standard chip 5 is accordingly assessed as fault-free.

The standard chip 6 is assessed as fault-free because none of the chips assigned to it is assessed as faulty. By contrast, the standard chip 7 is assessed as faulty because the chips 2h and 2i are faulty and the sum of their area proportions covered by the standard chip 7 is greater than the area of a chip. Accordingly, the value 1 is transferred reliably, i.e., with probability 1 to the standard wafer 7.

The introduction of a standard wafer with standard chips and the associated area normalization or the associated area-normalized wafer maps enables cross-product comparisons of wafer maps. Furthermore, the introduction of a standard wafer with standard chips significantly facilitates the identification of deviations caused by design, test technique, technology, process and production. The area-normalized yield which can be determined with the aid of the standard wafer may serve as a monitor for the so-called "yield" ("yield performance"). In this case, statements can be made with regard to the mean and the variance.

The introduction of a standard wafer with standard chips and the associated area normalization or the associated area-normalized wafer maps makes it possible to express technological differences between different process groups. By way of example, the product of the number n, of assumed critical planes, and D, the associated electrically effective defect density, can be calculated using the following formula:

$$K*n*D = -\ln(Y\_fn)/A\_fn$$

where Y_fn denotes the area-normalized yield, A_fn denotes the standard area of the standard chips and K denotes the integration density of the chips.

Furthermore, the correlation to defect density data is significantly facilitated by the method according to the invention. In particular, the area-normalized yield Y_fn can easily be calculated using theoretically calculated distributions.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various Figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A method for fault analysis in wafer production, comprising:

a) providing at least a first wafer with a multiplicity of chips, and a second wafer with a multiplicity of chips, wherein sizes of chips on the first wafer, a first chip size, differ from those on the second wafer, a second chip size;

b) examining the chips at least with regard to one or more properties, thereby producing results;

c) transferring the results to at least one standard wafer map with a predetermined number of standard chips which each have a predetermined size, the predetermined size remaining the same for the examined chips of the first size and the examined chips of the second size;

d) evaluating the transferred results; and e) providing evaluated transferred results for at least one of storage in a wafer database and identification of or determining a cause of faults.

2. The method as claimed in claim 1, further comprising:

assigning each standard chip on the at least one standard wafer map to at least one chip on the wafers in such a way that results of the examination may be transferred to the standard wafer map.

3. The method as claimed claim 2, further comprising:

transferring the results of the examination to the standard wafer map, the results for the standard chips being determined from the results of the assigned chips.

4. The method as claimed in claim 3, wherein a standard chip has a specific result if at least one of the assigned chips has the result.

5. The method as claimed in claim 3, wherein a standard chip has a specific result if a weighted sum of the results of the assigned chips fulfills a predetermined criterion.

6. The method as claimed in claim 5, further comprising:

determining the weighted sum of the results using covered proportions of the area of the chips assigned to the standard chip.

7. The method as claimed in claim 3, further comprising:

transferring at least one specific result according to a random principle from the chips assigned to the respective standard chip to the standard chip.

8. The method as claimed in claim 7, wherein a probability with which the specific result is transferred to the standard chip depends on a sum of a proportions of the area—covered by the standard chip—of the chips which have the specific result.

9. The method as claimed in claim 1, further comprising:

examining the chips with regard to their functionality.

10. The method as claimed in claim 9, further comprising:

determining a yield of functioning chips per area for the evaluation.

11. The method as claimed in claim 9, further comprising:

determining a defect density for the evaluation.

12. A method for fault analysis in wafer production, comprising:

a) providing at least one wafer with a multiplicity of chips;

b) examining the chips at least with regard to one or more properties thereby producing results;

c) transferring the results to at least one standard wafer map with a predetermined number of standard chips which each have a predetermined size;

d) evaluating the transferred results;

e) providing evaluated transferred results for at least one of storage in a wafer database and identification of or determining a cause of faults;

f) assigning each standard chip on the at least one standard wafer map to at least one chip on the wafer in such a way that results of the examination may be transferred to the standard wafer map; and g) assigning a respective chip on the wafer to the standard chip on the standard wafer map which covers a largest proportion of area of the chip if the standard wafer map is projected onto the wafer.

13. A method for fault analysis in wafer production, comprising:

a) providing at least one wafer with a multiplicity of chips;

b) examining the chips at least with regard to one or more properties, thereby producing results;

c) transferring the results to at least one standard wafer map with a predetermined number of standard chips which each have a predetermined size;

d) evaluating the transferred results;

e) providing evaluated transferred results for at least one of storage in a wafer database and identification of or determining a cause of faults;

f) assigning each standard chip on the at least one standard wafer map to at least one chip on the wafer in such a way that results of the examination may be transferred to the standard wafer map; and g) assigning a respective chip on the wafer to the standard chips on the standard wafer map which cover a proportion of an area of the chip if the standard wafer map is projected onto the wafer.

14. A method for fault analysis in wafer production, comprising:

a) providing at least one wafer with a multiplicity of chips;

b) examining the chips at least with regard to one or more properties, thereby producing results;

c) transferring the results to at least one standard wafer map with a predetermined number of standard chips which each have a predetermined size;

d) evaluating the transferred results;

e) providing evaluated transferred results for at least one of storage in a wafer database and identification of or determining a cause of faults;

f) assigning each standard chip on the at least one standard wafer map to at least one chip on the wafer in such a way that results of the examination may be transferred to the standard wafer map;

g) assigning a standard chip to all chips whose area is completely covered by the standard chip if the standard wafer map is projected onto the wafer; and h) assigning a standard chip, according to a random principle, chips whose area is incompletely covered by the standard chip if the standard wafer map is projected onto the wafer.

15. A method for fault analysis in wafer production, comprising:

a) providing at least one wafer with a multiplicity of chips;

b) examining the chips at least with regard to one or more properties, thereby producing results;

c) transferring the results to at least one standard wafer map with a predetermined number of standard chips which each have a predetermined size;

d) evaluating the transferred results;

e) providing evaluated transferred results for at least one of storage in a wafer database and identification of or determining a cause of faults;

f) assigning each standard chip on the at least one standard wafer map to at least one chip on the wafer in such a way that results of the examination may be transferred to the standard wafer map; and g) constructing the coordinates of the standard wafer according to the formula $$x\_new = \text{round}((x - x\_min + \text{random}) * (x\_new\_max - x\_new\_min + 1)/(x\_max - x\_min + 1) - 0.5) + x\_new\_min$$

and $$y\_new = \text{round}\,((y-y\_min+\text{random})*(y\_new\_max-y\_new\_min+1)/(y\_max-y\_min+1)-0.5)+y\_new\_min$$

where x_new_min, x_new_max, y_new_min and y_new_max comprise boundaries of a grid of the standard wafer, and x_min, x_max, y_min and y_max comprise boundaries of a grid of the wafer;

wherein the function random generates uniformly distributed random numbers in the interval (0, 1) and wherein the coordinates x and y are coordinates on the at least one wafer.

16. A method for fault analysis in wafer production, comprising:

a) providing at least one wafer with a multiplicity of chips;

b) examining the chips at least with regard to one or more properties, thereby producing results;

c) transferring the results to at least one standard wafer map with a predetermined number of standard chips which each have a predetermined size, at least one of the standard chips having an area that is a non-integer multiple of an area of at least one of the examined chips;

d) evaluating the transferred results; and e) providing evaluated transferred results for at least one of storage in a wafer database and identification of or determining a cause of faults.

\* \* \* \* \*